United States Patent [19]

Murakami et al.

[11] 4,149,127
[45] Apr. 10, 1979

[54] DIELECTRIC RESONATOR STABILIZED MICRO-STRIP OSCILLATORS

[75] Inventors: Yoshikazu Murakami, Tokyo; Yasutoshi Komatsu, Kanagawa, both of Japan

[73] Assignee: Sony Corporation, Tokyo, Japan

[21] Appl. No.: 871,141

[22] Filed: Jan. 20, 1978

[30] Foreign Application Priority Data

Jan. 21, 1977 [JP] Japan .................................. 52-6159

[51] Int. Cl.² ............................................. H03B 5/18
[52] U.S. Cl. ....................................... 331/96; 331/99; 331/117 D; 333/219
[58] Field of Search .......... 331/96, 99, 117 D, 107 R, 331/107 G; 331/82 R

[56] References Cited

U.S. PATENT DOCUMENTS 4,016,506  4/1977  Kofol ..................................... 331/96

OTHER PUBLICATIONS

Bearse, "Mw Sources Improving in Tuning and Stability," Microwaves, Mar. 1974, pp. 36–40.
Maeda et al., IEEE Transactions on Microwave Theory and Techniques, vol. MTT-23, No. 8, Aug. 1975, pp. 661–667.

Primary Examiner—Siegfried H. Grimm
Attorney, Agent, or Firm—Hill, Gross, Simpson, Van Santen, Steadman, Chiara & Simpson

[57] ABSTRACT

Dielectric resonator stabilized micro-strip oscillators in which micro-strip lines are provided to the first, second and third terminals of the active element for oscillation and in which a dielectric resonator coupled at a predetermined position to one of the micro-strip lines which is not used as an output terminal is disclosed. In the integrated microwave oscillator, there is an active element for oscillation such, for example, as GaAs-FET having first, second and third terminals. Micro-strip lines connect to the first and third terminals, and a micro-strip line connected between the first and third terminals form a feedback circuit, together with the first mentioned micro-strip lines. A dielectric resonator is coupled to one of these micro-strip lines which is not used as an output terminal at a predetermined location.

2 Claims, 10 Drawing Figures

DIELECTRIC RESONATOR STABILIZED MICRO-STRIP OSCILLATORS

BACKGROUND OF THE INVENTION

1. Field of the Invention

This invention relates generally to an integrated microwave oscillator with high density in which a 3-terminal active element is used as an oscillating element, and is directed more particularly to an integrated microwave oscillator which is simple in construction but can operable stably even for any temperature variation.

2. Description of the Prior Art

In the art there has been proposed a microwave oscillator which utilizes a 2-terminal negative resistance element or 3-terminal active element, for example, gallium-arsenide field effect transistor (which will be hereinafter referred to simply as $G_aA_s$-FET) as an oscillating element. A design of the oscillator which uses the $G_aA_s$-FET is disclosed in, for example, IEEE MTT-23, No. 8, pages 661 to 667 Design and Performance of X-Band Oscillators with GaAs Schottky-Gate Field-Effect Transistors which was issued in August 1975 by Maeda, et al. The advantages of the oscillator using a $G_aA_s$-FET are that it is low in noises, high in efficiency and low in bias voltage as compared with an oscillator which uses a Gunn diode or IMPATT diode.

In a microwave oscillating circuit which uses a 3-terminal active element as its oscillating element there are two kinds, namely a series feedback type oscillating circuit and a parallel feedback type oscillating circuit whose equivalent circuits are illustrated in FIGS. 1 and 2, respectively.

In FIG. 1 which shows the series feedback type oscillating circuit, numeral 1 designates a $G_aA_s$-FET or 3-terminal active element as an oscillating element, 2, 3 and 4 designate its gate, drain and source terminals, respectively. Numeral 5 designates a series feedback circuit as a positive feedback circuit which is formed of inductive or capacitive elements 6 and 7. In this case, it is selected that if one of these elements 6 and 7 is inductive, the other element is capacitive. The gate terminal 2 is connected to one end of a capacitive or inductive element 6 of the positive feedback circuit 5, the source terminal 4 is similarly connected to one end of the inductive or capacitive element 7 of positive feedback circuit 5, and the drain terminal 3 is connected to one end of a load impedance element 8. The other ends of these elements 6, 7 and 8 are connected common.

In FIG. 2 which shows a parallel feedback type circuit, numeral 1 similarly designates a $G_aA_s$-FET as a 3-terminal active element which is used as an oscillating element, and 9 designates a parallel feedback circuit as a positive feedback circuit. The parallel feedback circuit 9 is formed of inductive or capacitive elements 10 and 11 which are selected such that when one of them is inductive the other is capacitive. The inductive or capacitive element 10 is connected between gate terminal 2 and source terminal 4 of $G_aA_s$-FET 1 and the capacitive or inductive element 11 is connected between gate terminal 2 and drain terminal 3, respectively. Further, a load admittance element 12 is connected between drain terminal 3 and source terminal of $G_aA_s$-FET 1.

If the positive feedback circuits 5 and 9 of oscillating circuits shown in FIGS. 1 and 2 are made by using a line such as a micro-strip line and so on, they can be made as an integrated microwave oscillator.

The practical construction of the series feedback type oscillator shown in FIG. 1 will be now described with reference to FIG. 3. In FIG. 3, numeral 13 designates a substrate of a microwave integrated circuit which consists of a dielectric made of, for example, alumina $Al_2O_3$, a conductive layer formed uniformly on its rear surface and a conductive layer of a desired pattern on the front surface and a conductive layer of a desired pattern on the front surface of the dielectric. The $G_aA_s$-FET 1 is provided on the substrate 13 as a 3-terminal active element for oscillation. The gate terminal 2 of $G_aA_s$-FET 1 is connected to a micro-strip line 15 whose tip end is opened and which forms the element 6 shown in FIG. 1 and the source terminal 4 of $G_aA_s$-FET 1 is connected to a micro-strip line 16 which forms the element 7 and whose tip end is short-circuited. The tip end of micro-strip line 16 is short-circuited by connecting the tip end to an earth conductor 17. The drain terminal 3 of $G_aA_s$-FET 1 is connected to a micro-strip line 18 which is, in turn, connected through a gap capacitor 19 of choking a DC current to a high frequency output terminal 20.

On the substrate 13 there are provided high impedance lead wires 21 and 22 whose tip ends are connected to micro-strip line 15, to which the gate terminal 2 is connected, and to micro-strip line 18 to which the drain terminal 3 is connected, respectively. Positive and negative DC biases are applied through the lead wires 21 and 22 to the gate and drain of $G_aA_s$-FET 1 from the outside.

The micro-strip lines 15, 16 and 18 of the above circuit can become capacitive elements or inductive elements in accordance with the relation of their lengths to the wavelength of a microwave. To this end, the lengths of micro-strip lines 15, 16 and 18 are selected suitably.

Since the equivalent circuit of the series feedback oscillator of FIG. 3 can be shown in FIG. 1 as described previously, its operation will be described with reference to FIG. 1. If it is assumed that the output impedance seen to the active element 1 including the positive feedback circuit 5 from the both ends of load impedance element 8 is taken as $Z_{out}$ and the impedance of load impedance element 8 as $Z_L$, the oscillation frequency $f_o$ of the oscillator is determined as a frequency which will satisfy the frequency oscillaton condition, i.e. the following equation (1).

$$I_m(Z_{out}) + I_m(Z_L) = 0 \qquad (1)$$

where $I_m(Z_{out})$ and $I_m(Z_L)$ represent the imaginary number portions of $Z_{out}$ and $Z_L$, respectively.

In the case of the parallel feedback type oscillator which is not shown but whose equivalent circuit is shown in FIG. 2, its oscillation frequency $f_o$ is similarly determined as a frequency which will satisfy the following equation (2).

$$I_m(Y_{out}) + I_m(Y_L) = 0 \qquad (2)$$

If the function of the left side of equation (1) or (2) is taken as F, this is a function whose variables are the angular frequency $\omega$ and all circuit parameters forming the oscillator such as the active element, passive elements, for example, micro-strip lines and so on. While, the respective circuit parameters vary in accordance with variation of temperature T, so that the circuit parameters are the function of the temperature T. Further, the function F is a function of the angular frequency ω and temperature T. Therefore, the function F can be expressed as F (ω, T). At this time, the oscillation condition is expressed by the following equation (3)

$$F(\omega, T) = 0 \qquad (3)$$

Accordingly, the change of angular frequency ω of the oscillation frequency for temperature T or ∂ω/∂T can be expressed by the following equation (4).

$$\frac{\partial \omega}{\partial T} = -\frac{\partial F/\partial T}{\partial F/\partial \omega} \qquad (4)$$

From the equation (4) it will be understood that in order to make the temperature change ∂ω/∂T of angular frequency ω of the oscillation frequency small, it is sufficient to decrease ∂F/∂T or to increase ∂F/∂ω.

As shown in FIG. 3, with the prior art integrated microwave oscillator, its feedback circuit is formed by making the rip ends of lines such as the strip lines open or short-circuited. Therefore, it can not be possible to select the value of ∂F/∂ω in the equation (4) so great and hence the temperature change ∂ω/∂T of the oscillation frequency can not be made so small.

OBJECTS AND SUMMARY OF THE INVENTION

Accordingly, it is an object of the present invention to provide a novel integrated microwave oscillator.

Another object of the invention is to provide an integrated microwave oscillator which is simple in construction but can stabilize its oscillation frequency irregardless of temperature variation.

Accordingly to an aspect of the present invention there is provided an integrated microwave oscillator which comprises an active element for oscillation having first, second and third terminals, micro-strip lines connected to said first, second and third terminals, respectively, and forming a feedback circuit, and a dielectric resonator coupled to one of said micro-strip lines which is not used as an output terminal at a predetermined position.

According to another aspect of the present invention there is provided an integrated microwave oscillator which comprises an active element for oscillation having first, second and third terminals, micro-strip lines connected to said first and third terminals, a micro-strip line connected between said first and third terminals to form a feedback circuit together with said first-mentioned micro-strip lines, and a dielectric resonator coupled to one of said micro-strip lines which is not used as an output terminal at a predetermined position.

The other objects, features and advantages of the invention will become apparent from the following description taken in conjunction with the accompanying drawings through which the like numerals designate the like elements.

DESCRIPTION OF THE PREFERRED EMBODIMENTS

An example of the integrated microwave oscillator according to the present invention will be hereinafter described with reference to FIGS. 4 and 5.

Figure 1:
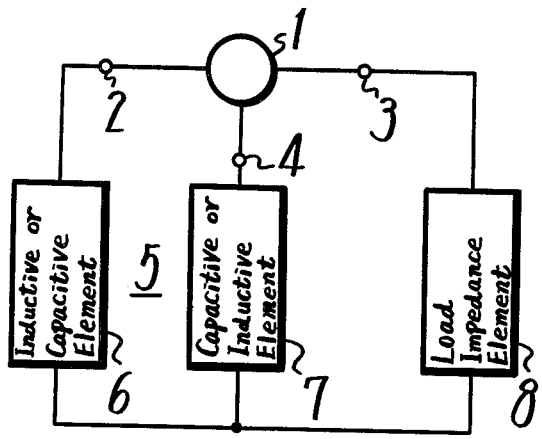
FIG. 1 is a circuit diagram showing an equivalent circuit of a prior art series feedback type microwave oscillator using a 3-terminal semiconductor active element.
Figure 2:
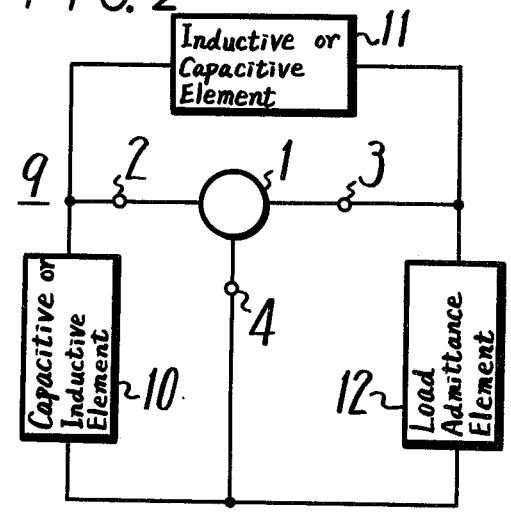
FIG. 2 is a circuit diagram showing an equivalent circuit of a prior art parallel feedback type microwave oscillator.
Figure 3:
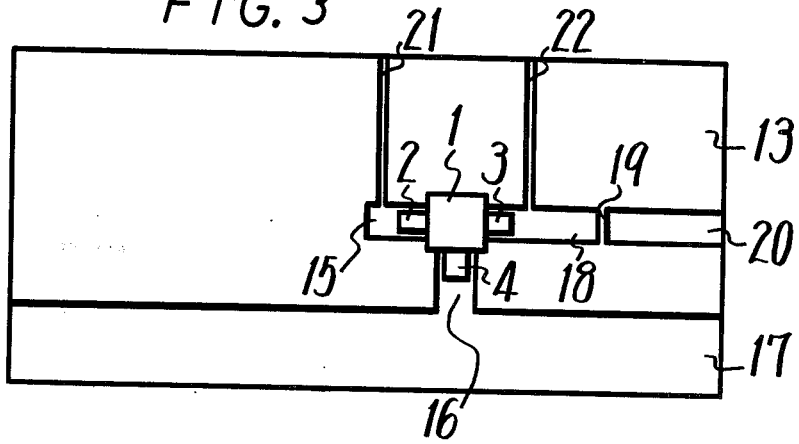
FIG. 3 is a plan view showing the construction of a prior art integrated microwave oscillator.
Figure 4:
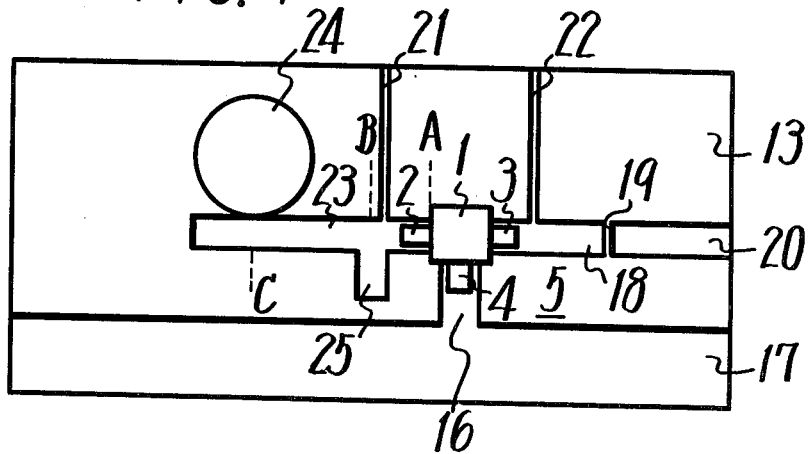
FIG. 4 is a plan view showing a practical construction of an example of the integrated microwave oscillator according to the present invention.
Figure 5:
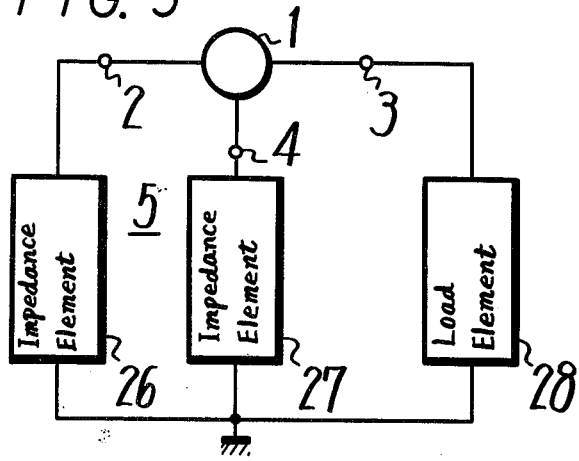
FIG. 5 is a circuit diagram showing an equivalent circuit of FIG. 4.

FIG. 4 is a plan view showing a practical construction of an example of the integrated microwave oscillator according to the invention and FIG. 5 is an equivalent circuit of FIG. 4 in which the parts same as those of FIGS. 1 to 3 are marked with the same reference numerals.

In FIG. 4, 3-terminal active element 1 as an oscillating element is made of a $G_aA_s$-FET which is superior in high frequency characteristics and micro-strip lines are used as lines. In the figure, numeral 24 designates a dielectric resonator whose dielectric constant is selected, for example, as 30 to 40 and which is formed of a cylindrical shape. The source terminal 4 of $G_aA_s$-FET 1 as its second terminal is connected to a micro-strip line 16 whose tip end is connected to an earth conductor 17 to be short-circuited and hence to form an impedance element 27 (refer to FIG. 5). The gate terminal 2 of $G_aA_s$-FET 1 as its first terminal is connected to a micro-strip line 23 whose tip or free end portion is coupled to the dielectric resonator 24 and whose tip end is opened to thereby form an impedance element 26 (refer to FIG. 5). The drain terminal 3 of $G_aA_s$-FET 1 as its third terminal is connected to micro-strip line 18 to form an element 28 as a load (refer to FIG. 5). The micro-strip line 18 is connected through a gap capacity 19, which operates to block a DC current, to a high frequency output terminal 20, Between this output terminal 20 and earth conductor 17 there is connected a load resistor (not shown) having a resistance value of, for example, 50 Ω which is supplied with the high frequency output. In this case, the impedance elements 26, 27 and load element 28 form the series feedback circuit 5. Further, similar to the prior art oscillator shown in FIG. 3, on the substrate 13 there are provided high impedance lead wires 21 and 22 through which negative and positive DC biases are applied to the gate terminal 2 and drain terminal 3 of $G_aA_s$-FET 1.

Next, a description will be given on the practical positional relation among the micro-strip lines 23, 16, 18 and dielectric resonator 24. If it is assumed that the propagating wavelength at a designed oscillation frequency is taken as $\lambda_g$, the length of micro-strip line 23 connected to the gate terminal 2 is selected same as the propagating wavelength $\lambda_g$. A stub 25 is provided for adjusting the frequency at a point B on the micro-strip line 23 apart from its one end A at the gate terminal 2 by $\frac{1}{4}\lambda_g$. The micro-strip line 23 is coupled, at its point C apart from point B by $\frac{1}{2}\lambda_g$, to the cylindrical dielectric resonator 24 whose dielectric constant is selected as 30 to 40. The reason is that the current distribution on the micro-strip line 23 becomes maximum at this coupling point and the coupling of micro-strip line 23 to the dielectric resonator 24 becomes greatest. The free end of micro-strip line 23 apart from the coupling point c by $\frac{1}{4}\lambda_g$ is opened. In the case of an integrated microwave oscillator, the propagating wave-length $\lambda_g$ is changed to be short depending upon the dielectric constant and so on.

The impedance viewed to dielectric resonator 24 from point B on micro-strip line 23 where the stub 25 is provided becomes a pure resistance component R at the resonance frequency of dielectric resonator 24. This value R is determined by the value of a load Q for dielectric resonator 24 and the coupling factor and is sufficiently high as compared with the characteristic impedance $Z_o$ of micro-strip lines which are transmission paths of the integrated microwave circuit. An impedance viewed to the feedback circuit 5 from the point A apart from the point B by $\frac{1}{4}\lambda_g$ becomes a such a value whose resistance component is $1/R$ and whose reactance component $X_1$ is determined by the line length of stub 25. Accordingly, an equivalent circuit of the oscillator shown in FIG. 4 can be illustrated as shown in FIG. 5. In the equivalent circuit of FIG. 5, the gate terminal 2 of $G_aA_s$-FET 1 is connected to the impedance element 26 which corresponds to the impedance of dielectric resonator 24, the source terminal 4 is connected to the impedance element 27, and the drain terminal 3 is connected to element 28 as a load. In this case, the other ends of elements 26, 27 and 28 are grounded.

If the value of resistance component $1/R$ of the impedance $Z_1$ viewed to feedback circuit 5 from point A is not sufficiently small, the effective factor of an output impedance $Z_{out}$ at the designed oscillation frequency does not become negative i.e. the condition $R_e(Z_{out})<0$ is not satisfied. Hence, such as oscillator which will oscillate at this frequency can not be formed. If, on the contrary, the value of resistance component $1/R$ is sufficiently small, by suitably selecting the length of stub 25 the reactance component $X_1$ of impedance $Z_1$ can be selected to safisfy the above frequency condition at the designed frequency and hence it become possible to construct an aimed oscillation.

Figure 6:
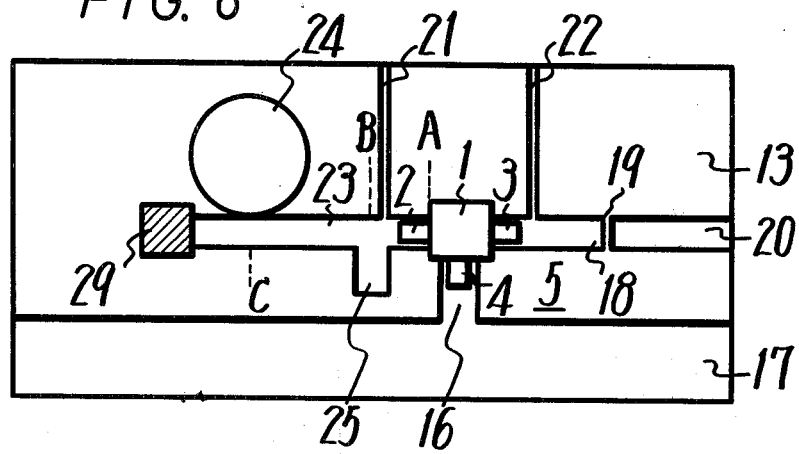
FIGS. 6, 7, 8 and 9 are plan views showing practical constructions of other examples of the present invention, respectively.

Another example of the invention will be described with reference to FIG. 6 in which the parts same as those of FIG. 4 are marked with the same reference numerals. In the example of FIG. 6, the opposite end of micro-strip line 23, to which the gate terminal 2 of $G_aA_s$-FET 1 is not connected, is formed as a non-reflected end 29, and the other circuit construction is substantially same as that of FIG. 4. At the frequency other than the resonance frequency of dielectric resonator 24, except the resonance frequency by stub 25, the resistance component of impedance $Z_1$ seen to the feedback circuit 5 from point A becomes substantially same as the characteristic impedance $Z_o$ of micro-strip line 23. Accordingly the effective factor component of load impedance $Z_{out}$ becomes positive i.e., $R_e(Z_{out})>0$ is satisfied and hence the above oscillating condition is not satisfied completely. As a result, it becomes possible that the microwave oscillator is prevented from being oscillated parasiticly.

Figure 7:
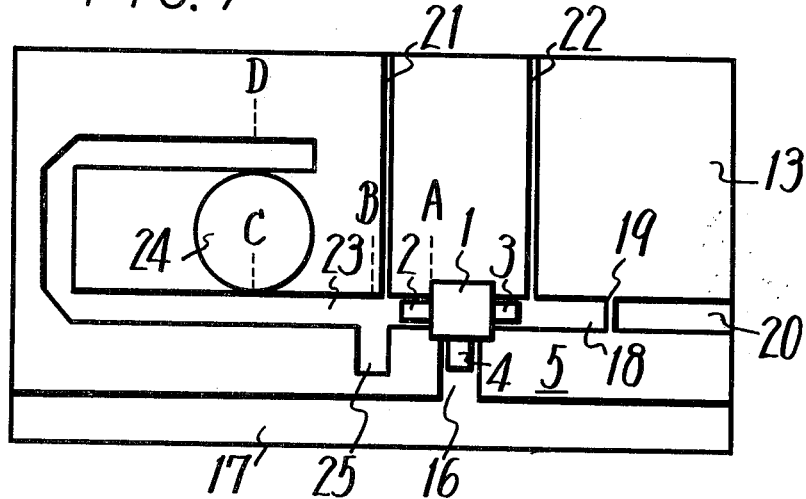

Turning to FIG. 7 a further example of the present invention will be described. In the example of FIG. 7, the micro-strip 23 is extended and then bent to be of a substantially L-shape and dielectric resonator 24 is coupled to micro-strip line 23 at point C and point D which is apart from the former point C by $n/2 \lambda_g$ (where $n$ is an integer). In this case, the free end of bent micro-strip line 23 is opened. The other circuit construction is substantially same as that of the above example.

With the circuit or oscillator constructed as shown in FIG. 7, the dielectric resonator 24 can be coupled to micro-strip line 23 with high coupling degree or factor and hence the resistance R viewed to the dielectric resonator 24 from point B at the resonance frequency can be made further great as compared with that of FIG. 4. Accordingly, the resistance component $1/R$ of impedance $Z_1$ viewed to feedback circuit 5 from point A can be made much small. As a result, even if an active element which is superior especially in high frequency characteristic is not used, the effective factor component of output impedance $Z_{out}$ viewed to active element 1 from drain terminal 3 including the series type feedback circuit 5 becomes negative or $R_e(Z_{out})>0$ is satisfied and consequently the power out-put oscillating condition can be satisfied.

Figure 8:
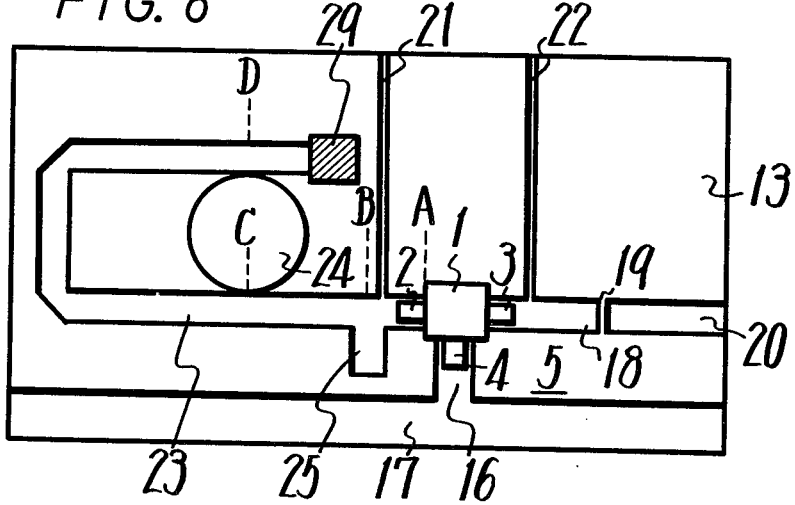

FIG. 8 shows a further example of the invention. In this example, the free end of bent micro-strip line 23 shown in FIG. 7 is formed as a non-reflected end 29 and the other circuit construction is substantially same as that of FIG. 7. With the example of the invention shown in FIG. 8, any parasite oscillation in case of a microwave oscillator can be suppressed.

Figure 9:
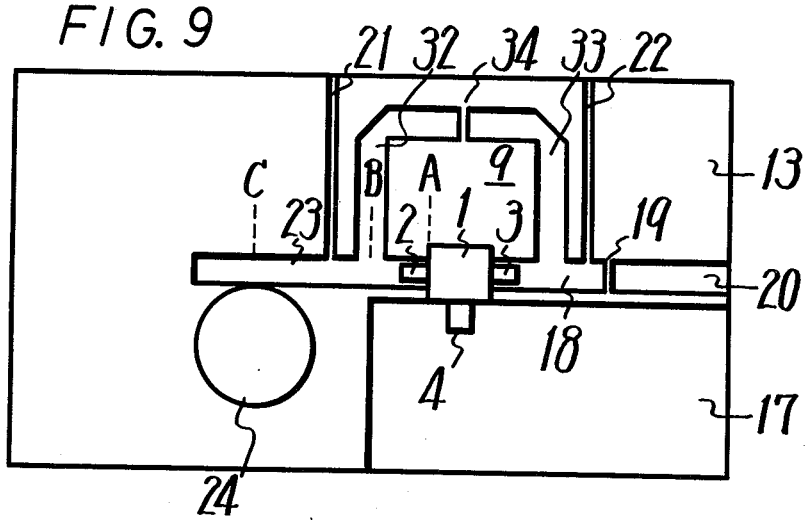

In the above examples, the present invention is applied to the series feedback type microwave oscillator, but the invention can be applied to a parallel feedback type microwave oscillator as shown in FIG. 9. In case of FIG. 9, the first or gate terminal 2 of $G_aA_s$-FET 1 or active element is connected to micro-strip line 23 which has the length same as the propagating length $\lambda_g$ at the microwave oscillating frequency and the micro-strip line 23 is coupled to dielectric resonator 24 at point C apart from the base point A of gate terminal 2 by $\frac{3}{4}\lambda_g$. The source terminal 4 or second terminal of $G_aA_s$-FET 1 is connected at its base portion to an earth conductor 17 directly. A micro-strip line 32 is extended at right angles from micro-strip line 23 at point B apart from the base point A of gate terminal 2 by $\frac{1}{4}\lambda_g$ and is bent at right angles at a point apart from micro-strip line 23 by $\frac{1}{4}\lambda_g$. Also, a micro-strip line 33 is extended at right angles from micro-strip line 18 at a point apart from the base portion of drain terminal 3 by $\frac{1}{4}\lambda_g$ and then bent at right angles at a point apart from micro-strip line 18 to oppose the free end of the bent portion of line 32. Between the opposing ends of micro-strip lines 32 and 33 there is provided a gap 34. Thus, a second feedback circuit 9 is formed. In the example of FIG. 9, similar to the above examples, on the substrate 13 there are provided high impedance lead wires 21 and 22 by which negative and positive DC biases are applied to gate terminal 2 and drain terminal 3 of $G_aA_s$-FET 1, respectively.

The equivalent circuit of the example shown in FIG. 9 becomes similar to that shown in FIG. 2. In the example of FIG. 9, the micro-strip line 23 and dielectric resonator 24 connected thereto form an impedance element 10, and the micro-strip lines 32, 33 and gap capacity 34 formed therebetween construct another impedance element 11. Further, the micro-strip line 18 forms an impedance element 12.

Figure 10:
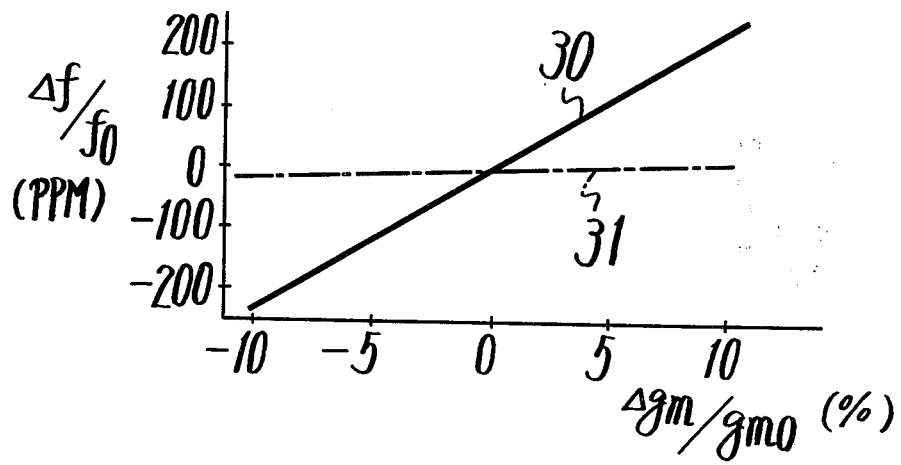
FIG. 10 is a characteristic graph showing the stability of the oscillation frequency of the integrated microwave oscillator of the invention in comparison with that of the prior art.

Next, with reference to FIG. 10, the effect that the oscillating frequency is stabilized by the microwave oscillator according to the present invention will be explained. FIG. 10 is a graph which shows the case of the prior art microwave oscillator shown in FIG. 3 having no oscillation frequency stabilizing means and the case of the microwave oscillator of the invention having the dielectric resonator for stabilizing the oscillation frequency. In this case, a mutual conductance gm of $G_a A_s$-FET 1 is selected as a parameter which will change depending upon temperature, and the temperature changes of the oscillation frequencies of the above oscillators are shown when the mutual conductance gm of $G_aA_s$-FET 1 is changed from its center by 10%. In the graph of FIG. 10, the abscissa represents a changing amount $\Delta$ gm/gmo of mutual conductance gm and the ordinate represents a deviation $\Delta f/f_o$ of the oscillation frequency from the designed oscillation frequency 11 GHz. In the graph of FIG. 10, a solid line curve 30 represents the frequency fluctuation of the prior art microwave oscillator shown in FIG. 3, while an one-dot-chain line curve 31 represents the frequency fluctuation of the microwave oscillator of the invention shown in FIG. 8. From the graph of FIG. 10, it will be understood that the frequency fluctuation for the temperature change of the invention is improved by about 5.7% as compared with that of the prior art.

In the examples of the invention shown in FIGS. 4, 6, 7 and 8, the stub 25 is provided for the designed oscillation frequency to satisfy the frequency oscillation condition. It is, however, possible that if only the coupling of micro-strip line 23 to dielectric resonator 24 is selected sufficiently high, the stub 25 can be omitted by suitably adjusting the length between points A and B with the same effect. In this case, the resistance component of impedance $Z_1$ viewed from point A to feedback circuit 5 is not so great. If the stub 25 is omitted and the free end of micro-strip line 23 is formed as the non-reflected end 29, there is caused no resonance by the stub and also there is no possibility that any parasite oscillation is caused at the frequency other than the resonance frequency of dielectric resonator 24.

According to the integrated microwave oscillator of the present invention, the micro-strip lines which form the first feedback circuit are connected to the first, second and third terminals of the active element for the oscillation and one of the micro-strip lines which is not used as the output terminal is connected at its predetermined position with the dielectric resonator, so that by coupling a part of the micro-strip lines, which form the feedback circuit, to the dielectric resonator, which will resonate at the designed oscillation frequency, the reactance component of the feedback circuit can be changed greatly near the oscillation frequency and the oscillation frequency can be stabilized much for temperature change by setting the factor $\partial F/\partial \omega$ in the equation (4) great.

Further, if the dielectric resonator is formed to make the temperature coefficient zero or compensating for the temperature characteristic of the oscillator, the oscillation frequency can be stabilized further.

With the present invention, even in the case that the micro-strip lines are connected to the first and third terminals of the active element for the oscillation, the micro-strip line, which forms the feedback circuit together with the former micro-strip lines, is connected between the first and third terminals and one of these micro-strip lines, which is not used as the output terminal, is connected at predetermined position with the dielectric resonator, the reactance component of the feedback circuit can be changed greatly at the vicinity of the oscillation frequency and hence the oscillation frequency can be stabilized similarly.

In the examples shown in FIGS. 6 and 8, the non-reflected end 29 is formed on the substrate 13, but it is not always necessary. Even if it is formed of a coaxial non-reflected end outside the substrate 13 with the same effect to stabilize the frequency.

Further, it is of course no need that the dielectric resonator 24 is of a cylindrical shape as in the above examples, but it could be of a rectangular prism shape with the same effect.

Further, in the above examples the dielectric resonator 24 is coupled to micro-strip line 23 which is connected to the gate terminal 2 of $G_aA_s$-FET 1, but it is of course possible with the same result that the dielectric resonator 24 is coupled to the micro-strip line 16 which connected with the source terminal 4 of $G_aA_s$-FET 1.

Further, FIGS. 4, 6, 7 and 8 shows the series feedback type oscillating circuits of the invention and FIG. 9 shows the parallel feedback type oscillating circuit, respectively, but the series and parallel feedback type oscillating circuits can be used together with the same effect as that the oscillation frequency can be highly stabilized for the temperature change.

It will be apparent that many modifications and variations could be effected by one skilled in the art without departing from the spirits or scope of the novel concepts of the present invention.

We claim as our invention:

1. An integrated microwave oscillator comprising:
   (a) an active element for oscillation having first second and third terminals;
   (b) micro-strip lines connected to said first, second and third terminals, respectively, and forming a feedback circuit; and
   (c) a dielectric resonator coupled at a predetermined position to one of said micro-strip lines which is not used as an output terminal.

2. An integrated microwave oscillator comprising:
   (a) an active element for oscillation having first, second and third terminals;
   (b) micro-strip lines connected to said first and third terminals;
   (c) a micro-strip line connected between said first and third terminals to form a feedback circuit together with said first-mentioned micro-strip lines; and
   (d) a dielectric resonator coupled at a predetermined position to one of said micro-strip lines which is not used as an output terminal.

* * * * *